US006399473B1

United States Patent
Fischer et al.

(10) Patent No.: US 6,399,473 B1
(45) Date of Patent: Jun. 4, 2002

(54) METHOD OF PRODUCING A II-VI SEMICONDUCTOR COMPONENT CONTAINING SELENIUM AND/OR SULRFUR

(75) Inventors: Frank Fischer, Würzburg; Matthias Keller, Wiesthal; Thomas Litz; Gottfried Landwehr, both of Würzburg; Hans-Jürgen Lugauer, Gerbrunn; Andreas Waag, Würzburg; Markus Keim, Ansbach, all of (DE)

(73) Assignee: Osram Opto Semiconductors GmbH & Co. oHG, Regensburg (DE)

( * ) Notice: Subject to any disclaimer, the term of this patent is extended or adjusted under 35 U.S.C. 154(b) by 0 days.

(21) Appl. No.: 09/480,758

(22) Filed: Jan. 10, 2000

Related U.S. Application Data

(63) Continuation of application No. PCT/DE98/01883, filed on Jul. 8, 1998.

(30) Foreign Application Priority Data

Jul. 8, 1997 (DE) ........................................ 197 29 186

(51) Int. Cl.[7] ...................... H01L 21/28; H01L 21/3205
(52) U.S. Cl. .......................... 438/602; 438/22; 438/603
(58) Field of Search ............................ 438/22, 46, 767, 438/930, 602

(56) References Cited

U.S. PATENT DOCUMENTS

| 5,399,206 A | * 3/1995 | de Lyon ...................... 148/334 |
| 5,422,902 A |   6/1995 | Mensz |
| 5,818,859 A | * 10/1998 | Miller et al. .................. 372/45 |
| 5,989,339 A | * 11/1999 | Tamamura et al. ......... 117/107 |

FOREIGN PATENT DOCUMENTS

EP   0 702 101 A2   3/1996

OTHER PUBLICATIONS

International Publication WO 97/18592 (Fischer et al.), dated May 22, 1997.
Japanese Patent Abstract No. 08148765 (Hiroshi), dated Jun. 7, 1996.
Gaines, J. M. et al.: "Structual properties of ZnSe Films grown by migration enchanced epitaxy", J. Appl. Phys. vol. 73, No. 6, Mar. 15, 1993, pp. 2835–2840.
Chu, C. C. et al.: "Reduction of Structual defects in II–VI blue green laser diodes", Appl. Phys. Lett. vol. 69, No. 5, July 29, 1996, pp. 602–604.
L. H. Kuo et al.: "Generation of degradation defects, stacking faults, and misfit dislocations in ZnSe–based films grown on GaAs", J. Vac. Sci. Technol. B13 (4), Jul./Aug. 1995, pp. 1694–1704.
F. Fischer: Electrical properties of light–emitting devices based on II–IV compounds BeTe and BeMgZnSe, Materials Science and Engineering B43 (1997), pp. 92–96.
T.Litz et al.: "Molecular beam epitaxy of Be–related II–VI compounds", Materials Science and Engineering, B43 (1997), pp. 83–87.

(List continued on next page.)

Primary Examiner—Amir Zarabian
Assistant Examiner—Brad Smith
(74) Attorney, Agent, or Firm—Laurence A. Greenberg; Werner H. Stemer; Ralph E. Locher

(57) ABSTRACT

A II-VI semiconductor component is produced with an active layer sequence having at least one II-VI semiconductor layer containing Se and/or S on a substrate. First, an Se-free II-VI interlayer based on BeTe is grown epitaxially on the substrate in an essentially Se-free and S-free first epitaxy chamber. The active layer sequence is then grown epitaxially on the Se-free II-VI semiconductor layer.

14 Claims, 1 Drawing Sheet

OTHER PUBLICATIONS

H.–J. Lugauer et al.: "P–type doping of beryllium chalcogenides", Materials Science and Engineering, b43 (1997), pp. 88–91.

H.–J. Lugauer et al.: "p–Type doping of beryllium chalcogenides grown by molecular beam epitaxy", Journal of Crystal Growth 175/176 (1997), pp. 619–623.

A. Waag et al.: "Beryllium–containing materials for II–VI Laser Diodes", SPIE vol. 2994, pp. 32–42.

F. Fischer et al.: "II–VI light–emiting devices based on beryllium chalcogenides", Journal of Crystal Growth, 175/176 (1997), pp. 532–540.

* cited by examiner

METHOD OF PRODUCING A II-VI SEMICONDUCTOR COMPONENT CONTAINING SELENIUM AND/OR SULRFUR

CROSS-REFERENCE TO RELATED APPLICATION

This is a continuation of copending International Application PCT/DE98/01883, filed Jul. 8, 1998, which designated the United States.

BACKGROUND OF THE INVENTION

Field of the Invention

The invention lies in the semiconductor technology field. More specifically, the invention relates to a method of producing a II-VI semiconductor component, in which an active layer sequence having at least one II-VI semiconductor layer containing Se and/or S is applied on a substrate. It relates, in particular, to a method of producing laser diodes having a layer sequence exhibiting laser activity and consisting essentially of ZnMgSSe or BeMgznSe, in particular on a GaAs, Si or Ge substrate by means of molecular beam epitaxy (MBE) or metalorganic chemical vapor deposition (MOCVD).

The use of II-VI laser diodes based on ZnMgSSe or BeMgznSe has been unsuccessful in the state of the art because of the short lifetime which it has to date been possible to achieve for these components. The cause attributed to the deterioration, which follows a diffusion-limiting mechanism, are non-radiating areas, referred to as "dark spots" (DS) or "dark line defects" (DLD), which propagate and proliferate during operation of the laser diodes. On account of their structure, DSs and DLDs are identified as dislocation loops and dislocation dipoles in or in the vicinity of the active region. Their origin lies predominantly in extended crystal defects, such as, for example, dislocations or stacking faults, which for the most part occur at the interface between the II-VI layer sequence and the III-V substrate (cf. L. H. Kuo et al., Generation of Degradation Defects, Stacking Faults and Misfit Dislocations in ZnSe-Based Films Grown on GaAs, J. Vac. Sci. Technol. B, 13(4) (1995), 1694).

The nucleation of these multidimensional lattice defects may be due to a tendency toward chemical reaction between selenium atoms, or sulfur atoms, and the GaAs surface. Both of these chalcogens form strong bonds to III-V semiconductors, in particular to those containing Ga and In, such as GaAs, InAs or InGaAs. The resulting reaction products—for example $Ga_2Se_3$ or $Ga_2S_3$ are proposed—for numerous seeds at the substrate surface for the creation of stacking defects. This seed formation can occur even with small amounts of sulfur or selenium in the background pressure of the epitaxy reactor. This undesired contamination of the substrate surface with Se or S can take place by evaporation of these elements from hot filaments or furnace diaphragms; it is therefore extremely difficult to prevent this in a II-VI epitaxy reactor.

In order to stop the incorporation of stacking defects at the start of growing ZnSe on GaAs, various MBE techniques have been developed in which the reaction between Se and Ga is prevented. In this case, before the II-VI semiconductor layer is grown, the GaAs substrate is passivated, for example with Zn or Te, and this makes direct contact to Se atoms with the GaAs surface more difficult. To that end, the substrate is exposed to a Zn beam at low temperatures of about 230° C. inside the II-VI growth chamber, without the activation energy needed for the reaction between Se and Ga to take place being provided. For kinetic reasons, during the growth of ZnSe at such low temperatures—ZnSe is typically produced at between 270° C. and 320° C.—a transition to three-dimensional growth (island growth) takes place. Under these conditions, the coalescence of growth islands can lead to the incorporation of defects. The use of island growth can be circumvented using an MEE (migration enhanced epitaxy) process. During MEE growth, the crystal surface is presented alternately with Zn and Se, the atoms of a monolayer being provided, between each cycle, in spite of short diffusion lengths, with the time to take occupancy of favorable sites on the surface. Using this process, it has been possible to reduce the defect density in ZnSe or ZnSSe on GaAs to below $10^5$ cm$^{-2}$ (cf. J. M. Gaines et al., Structural Properties of ZnSe Films Grown by Migration enhanced Epitaxy, J. Appl. Phys. 73(6) (1993) 2835, and C. C. Chu et al., Reduction of Structural Defects in II-VI Blue-Green Laser Diodes, Appl. Phys. Lett. 69(5) (1996), 602).

Passivation with Te atoms provides a possible alternative to the Zn treatment (Zn-MEE). The chemical reactivity of Te with GaAs is significantly less than that of Se and S—Te/GaAs interfaces ought therefore to exist more stably in the crystal structure of the semiconductor matrix than Se/GaAs or S/GaAs. Under experimental conditions, however, poor adhesion of Te has been observed, and it was not possible to demonstrate any clear reduction of the defect density.

For an industrial process step in the production of II-VI semiconductor lasers, the proposed methods of preventing extended defects at the start of growing ZnSe on GaAs exhibit excessively poor reproducibility. A disadvantage with Zn preparation is therefore that the resultant Zn-As interlayer does not give it a defined surface, and dislocations can sometimes nucleate. Further, Se atoms from hot surfaces in the MBE reactor still continue to impair the passivation process. Selenium or sulfur in the background pressure have a similar effect on the Te passivation owing to the exchange reaction which takes place, in which Te is replaced by Se, and the concomitant low adhesion coefficient of Te, the Te passivation is less effective at protecting the GaAs substrate.

SUMMARY OF THE INVENTION

The object of the invention is to provide a method of producing a II-VI semiconducting component which overcomes the above-noted deficiencies and disadvantages of the prior art devices and methods of this kind, and which is simple in its implementation and with which the creation of stacking defects and dislocations at the junction between the substrate and the II-VI semiconductor material is prevented.

With the above and other objects in view there is provided, in accordance with the invention, a method of producing a semiconductor component with an active layer sequence with one or more II-VI semiconductor layers. The method comprises the following steps:

providing a substrate;

epitaxially growing an Se-free II-VI interlayer based on BeTe on the substrate in a substantially Se-free and S-free first epitaxy chamber; and epitaxially growing an active layer sequence with at least one II-VI semiconductor layer containing an element selected from the group consisting of Se and S on the Se-free II-VI semiconductor layer.

With the novel method according to the invention, it is advantageously possible to produce BeTe interlayers with high quality on a substrate, for example GaAs, using MBE. In this case, the BeTe layer acts as a buffer between a II-VI semiconductor layer containing Se or S, for example ZnMgSSe or BeMgZnSe, in such a way that no stacking defects or new dislocations are created at the interface with the substrate and spread through the layers above.

In accordance with an added mode of the invention, the inter-layer consists of $Be_xMg_yZn_{1-x-y}Te$, $Be_xZn_yCd_{1-x-y}Te$, $Be_xZn_yMn_{1-x-y}Te$, or $Be_xMn_yCd_{1-x-y}Te$.

In accordance with an additional feature of the invention, the substrate is a III-V semiconductor material, preferably GaAs, InAs, or InGaAs.

According to the invention, in particular, before the growth of an optoelectronic or electronic component made of II-VI semiconductor material, in particular BeMgZnSe, ZnMgSSe, MgZnCdSe, MgZnCdS or BeMgZnS, in a first essentially Se-free epitaxial reactor, a BeTe interlayer is deposited on the substrate crystal, which consists in particular of GaAS or InAs.

Using a BeTe interlayer to improve the start of the MBE growth of a selenide, for example BeMgZnSe or ZnMgSSe, on GaAs has already been described in international PCT publication WO 97/18592. A disadvantage with the process described therein is, however, that the process is only conditionally reproducible under the normal conditions of II-VI epitaxy, in particular the high proportion of Se and S in the base pressure of the reactor. Further, the electrical transport properties are impaired with the layer thicknesses proposed there for the buffer layer, since BeTe represents a barrier to electrons which becomes more and more difficult to tunnel through as its thickness increases.

In accordance with another feature of the invention, a thickness of the interlayer is between 0.5 to 100 monolayers.

In accordance with a further feature of the invention, a smooth buffer layer is applied on the substrate prior to the step of epitaxially growing the Se-free II-VI interlayer.

In accordance with again an added feature of the invention, the smooth buffer layer is formed, depending on the semiconductor material of the substrate, from GaAs, InAs, InGaAs, InP, GaP, GaSb, GaN, or mixed crystals formed thereof, from Ge, Si, SiGe, SiC, $Si_xC_{1-x}$, or mixed crystals formed thereof ($0 \leq x \leq 1$), from ZnO, ZnSe, CdTe, CdZnTe, or mixed crystals formed thereof, or from $Al_2O_3$. The smooth buffer layer may be an undoped layer, an n-type conductive doped layer, or a p-type conductive doped layer.

In accordance with again an additional feature of the invention, the interlayer is produced on the smooth upper layer in the same epitaxy chamber in which the buffer layer is produced.

In accordance with again a further feature of the invention, an As-rich surface is grown prior to growing the interlayer on the buffer layer.

In accordance with a concomitant feature of the invention, a matching layer is grown on the interlayer before the active layer sequence is grown.

By virtue of the process according to the invention, the density of extended crystal defects in the II-VI semiconductor component is lowered reproducibly. As a result of this, especially in the case of optoelectronic components, long-term stability and emission characteristics are improved significantly. The application according to the invention of a thin BeTe interlayer on, for example, a GaAs substrate and of a II-VI semiconductor layer, for example made of BeMg-ZnSe or ZnMgSSe, prevents selenium or sulfur from being able to reach the GaAs surface, which prevents the creation of stacking defects and dislocations at the junction between the II-VI semiconductor and the III-V semiconductor.

Other features which are considered as characteristic for the invention are set forth in the appended claims.

Although the invention is illustrated and described herein as embodied in a method of producing a II-VI semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
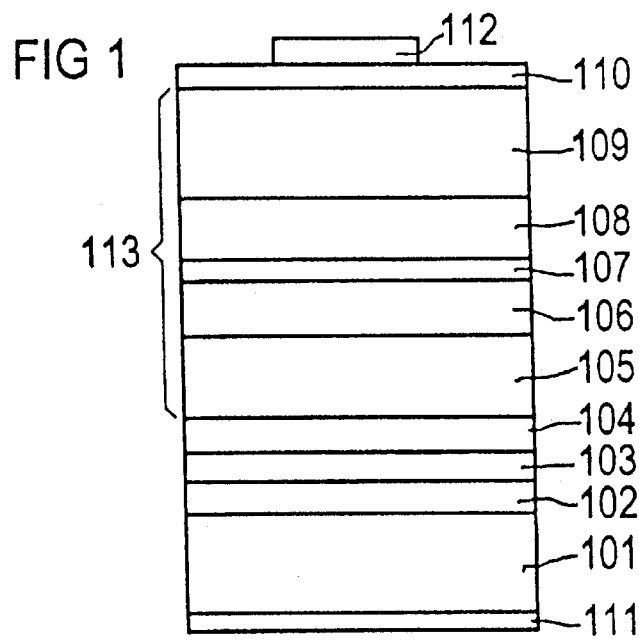
FIG. 1 is a diagrammatic sectional stack view of the structure of a light-emitting component having an interlayer produced using the process according to the invention in accordance with a first exemplary embodiment.

Referring now to the figures of the drawing in detail and first, particularly, to FIG. 1 thereof, there is seen a light-emitting component having an active region 107 between two wave guide layers 106, 108. The sandwich formed by the three layers 106, 107, 108 is in turn located between a first and a second cover layer 105, 109. On the main surface of the second cover layer 109, opposite from the active region 107, there is applied a contact layer 110 provided with a metal contact 112.

The active component layer sequence 113, consisting of the active region 107, the waveguide layers 106, 108, and the cover layers 105, 109, with the contact layer 110 and metal contact 112, is disposed on a substrate 101. Between the substrate 101, which has a metal contact 111 on its main surface on the other side from the active region 107, and the active component layer sequence there is, starting from the substrate 101, a buffer layer 102, an interlayer 103 and a matching layer 104. The interlayer 103 prevents the generation of stacking defects when the light-emitting component is being produced.

The interlayer 103 may be formed, for example, of BeTe, $Be_xMg_yZn_{1-x-y}Te$ and/or $Be_xZn_yCd_{1-x-y}Te$. The underlying buffer layer 102 and the substrate 101 may be formed, for example, of GaAs or Si, and the matching layer 104 of $Be_xMg_yZn_{1-x-y}Te$. The component layer sequence applied on top may be made from a sequence of $Be_xZn_yCd_{1-x-y}Se/Be_xMg_yZn_{1-x-y}Se/Be_uMg_vZn_{1-u-v}Se$ layers. The metal contacts 111, 112 are, for example, made from Au/Ge or In, or from Pd/Pt/Au.

Figure 2:
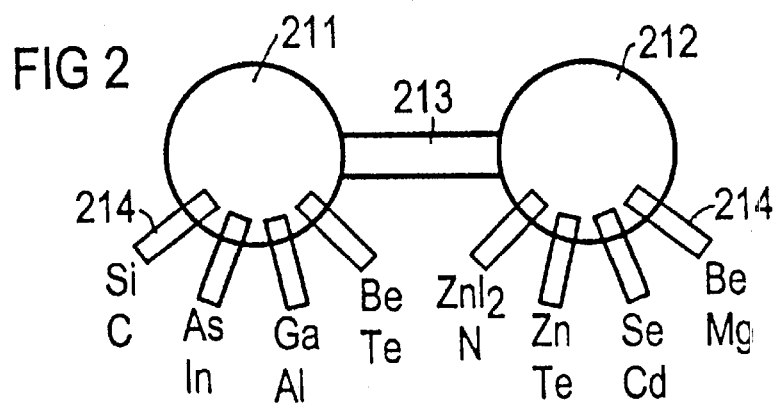
FIG. 2 is a diagrammatic view of the layout of an MBE system for producing II-VI semiconductor layers according to the first exemplary embodiment.

Referring now to FIG. 2, the structure of an MBE system shown therein is used to produce such a II-VI semiconductor component of this nature in accordance with a first exemplary embodiment. In a first MBE reactor 211 (first epitaxy chamber), a buffer layer 102 is firstly applied in order to improve the surface of the substrate 101. For example, GaAs, silicon or germanium may be used as the substrate and buffer materials. To that end, effusion cells 214 are provided which contain, for example, As, P, Sb, Ga, Al, In, Si, or C.

Effusion cells 214 for producing the interlayer 103, for example Be and Te, optionally Zn and Mg, are further provided in the first MBE reactor 211. It is important to assure that selenium or sulfur are prevented from being introduced into the first MBE reactor 211. The crucible material, in particular for Be, is a metal such as tantalum, molybdenum or tungsten, although a crucible made of BeO or pyrolytic graphite (PG) or pyrolytic boron nitride (PBN) is preferably used. In this regard, it should be noted that in the case of PBN and PG the operating temperature of the effusion cell should not exceed about 1000° C. The materials used should have a purity of at least 99.9%, and even better at least 99.999%.

Following the production of the III-V semiconductor buffer layer 102, for example of GaAs, which has been produced using growth parameters customary for the growth of GaAs, the interlayer 103, consisting in particular of BeTe, is grown. In the case of GaAs or InGaAs or InAs as the material for the buffer layer 102, it is recommended to prepare an As-rich surface of the GaAs buffer, which, for example, can be done by cooling the substrate 101 under an $As_2$ or $As_4$ flux following the growth. The BeTe or $Be_xMg_yZn_{1-x-y}Te$ or $Be_xZn_yCd_{1-x-y}Te$ interlayer 103 is formed by providing a Be and Te or $Te_2$ flux at substrate temperatures between 200° C. and 650° C., preferably at about 350° C. to 450° C. In this case, the Te in the atomic beams should be set to excess, so that the ratio in the fluxes between Te and Be is from about Te:Be=2 to Te:Be=50. A Te:Be ratio of about 4 to 10 is preferred, which is adjusted to high values in the upper temperature range, so that a Te-rich (2×1) reconstruction can always be observed in RHEED (reflection high energy electron diffraction) measurement during growth. The growth rate is preferably adjusted to between 0.01 monolayer/second and 1 monolayer/second.

At the start of growing the interlayer 103, in particular at the start of BeTe, either all the material fluxes can be provided at the same time, or a Te flux can be directed at the GaAs surface for a period of from 0.5 to 180 seconds, and the other components such as Be or Zn added afterwards. In this case, it may be necessary to pause for up to 30 seconds after the Te passivation. After the growth of the interlayer 103, the substrate 101 should be cooled to a temperature of between 50° C. and 600° C., and in this regard it should be pointed out that at high temperatures the (2×1) reconstruction should be maintained by providing Te during the cooling. Te should not, however, be vapor-deposited at a substrate temperature 250° C.

The process may also be modified by ceasing to add Te when the temperatures are still above 400° C., and in this case create modified surface coverage, which can be identified by a change from the (2×1) reconstruction to a (4×1) or other surface configuration in RHEED.

The first (III-V) MBE reactor 211 is connected via an ultra-high vacuum (UHV) transfer module 213 to a second (II-VI) MBE reactor 212 (second epitaxy chamber), in which the selenide or sulfide layers. (i.e., layers 105 to 109 in FIG. 1) are grown. There must be a UHV with a vacuum of better than $10^{-8}$ torr, in particular better than $10^{-9}$ torr, in the transfer module 213. The substrate 101 from the first MBE reactor 211 should be passed through the transfer module 213 at elevated temperatures of about 50° C. to 400° C. During this, care should be taken that no dust or other macroscopic contamination reaches the substrate surface. The residence time in the transfer module 213 should be kept as short as possible.

The growth in the second MBE reactor 212 on the interlayer 103 takes place at customary substrate temperatures, for example between 150° C. and 400° C. To that end, the surface of the interlayer 103 may once more be treated with a Te flux before the start of growing a selenide on BeTe—in FIG. 1, this is for example layer 104 or 105. For producing group II or group VI molecular beams, especially for Se and S, it is recommended to use sealable valve cells or cracker cells, in order to keep the selenium and sulfur background pressure as low as possible.

Figure 3:
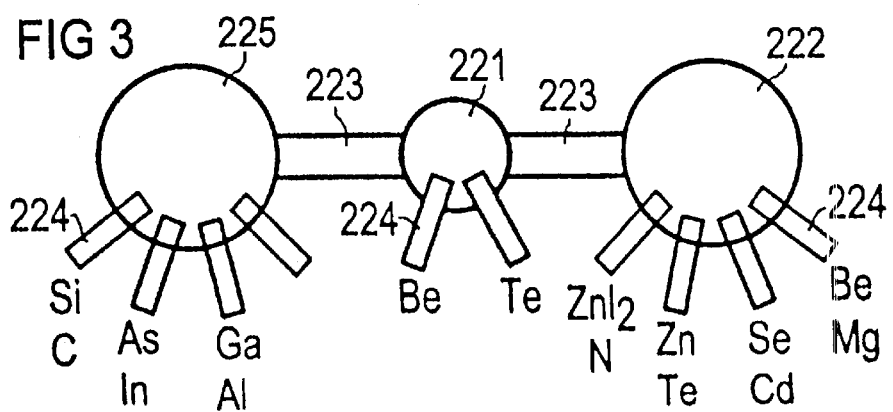
FIG. 3 is a diagrammatic view of the layout of an MBE system for producing II-VI semiconductor layers according to a second exemplary embodiment of the invention.

Referring now to FIG. 3, the structure diagrammed therein relates to the process of the invention in accordance with a second exemplary embodiment. Unlike in the first exemplary embodiment, a separate MBE reactor 225 is provided for producing a smooth buffer layer 102, consisting of III-V semiconductor material such as, for example GaAs, InAs or InGaAs, or of silicon or germanium. This separate MBE reactor 225 has effusion cells 224 which contain, for example, Ga, As, In, Al, Si, C or Ge. In a first MBE reactor 221, which is arranged downstream of the separate MBE reactor 225 and in which there is as little selenium and/or sulfur in the background pressure as possible, the interlayer 103, consisting for example of BeTe, is deposited epitaxially. The second MBE reactor 222, the transfer between the MBE reactors 225, 221 and 222 as well as the crucible materials and the process parameters for the III-V and II-VI growth are similar to the first exemplary embodiment.

The layer thicknesses produced for the interlayer 103 with the above-mentioned methods are essentially between 0.5 and 100 monolayers, and layer thicknesses of about 2 to 10 monolayers are preferably produced. The interlayer 103 may be undoped or doped. Iodine, bromine, chlorine, aluminum, indium or gallium are typically used for n-type doping. For p-type doping, elements such as N, As, Sb, P, Bi or K, Rb, Cs or Si, C, Ge, Sn, Pb may be used. The layers adjoining the interlayer 103, in particular the underlying buffer layer 102 made of GaAs or other III-V or elemental semiconductor materials and the overlying II-VI layers may be undoped or doped with n-type or p-type conductivity. Heavily doped layers are preferably used in order to connect electrical transport through the thin BeTe barrier.

In an alternative version of the process, the interlayer 103 is produced in a II-VI epitaxy chamber with reduced Se or S background pressure. It is thereby necessary to ensure that hot surfaces such as furnace diaphragms or filaments are degassed and the effusion of Se or S is prevented by fully closed furnace diaphragms, preferably by sealable valve or cracker cells. With this process the substrate 101 heated to the growth temperature of between 250° C. and 450° C., or the buffer layer 102, is tilted (rotated) in a Te and Be beam in a II-VI epitaxy chamber.

Optical-microscopy pictures of the surfaces of BeMgZnSe layers, superficially etched for 30 seconds with 60° C. hot HCl (32%), show etching pits created by selective etching attack by HCl on crystal defects. In II-VI semiconductor layers, there are three types of etching pits to distinguish between, which show a typical shape on the surface. Type-I etching pits are due to dislocations or Se-terminated stacking defects. Type-II pits are created by pairwise-occurring stacking defects which nucleate at sites of the GaAs substrate where reaction with selenium occurs. Individual stacking defects or dislocations can lead to small etching pits (Type III).

The table below, which shows a qualitative comparison of the defect densities achievable in BeMgZnSe heterostructures as a function of the substrate preparation, indicates the densities of etched defects as a function of various growth preparations. To that end, BeMgZnSe layers were applied directly on an unpassivated GaAs surface. In a different process, the GaAs surface was passivated with Zn, or an MEE ZnSe buffer was produced on a Zn-passivated surface. In contrast to these methods, the introduction of a BeTe buffer with the exclusion of selenium from the background pressure leads to a drastic reduction in the defect density for all the types mentioned. The defect densities achieved in this way are in a range of a few thousand per $cm^2$ and are therefore low enough to extend the lifetime of II-VI components.

TABLE

Substrate preparation

|  | Unpassivated | Zn-passivated | Zn MEE | BeTe buffer |
|---|---|---|---|---|
| Type I | $10^5$ $cm^{-2}$ | $10^7$ $cm^{-2}$ | $10^4$ $cm^{-2}$ | $10^3$ $cm^{-2}$ |
| Type II | $10^7$ $cm^{-2}$ | $10^7$ $cm^{-2}$ | $10^5$ $cm^{-2}$ | $10^2$ $cm^{-2}$ |
| Type III | $10^7$ $cm^{-2}$ | $10^7$ $cm^{-2}$ | $10^5$ - $10^4$ $cm^{-2}$ | $10^5$ - $10^4$ $cm^{-2}$ |

The description of the process according to the invention in conjunction with the exemplary embodiments is, of course, not to be taken as a restriction of the invention to these exemplary embodiments. Variations according to the invention of the layer sequences and components which are applied on a BeTe buffer, may likewise be formed on the basis of other semiconductor materials such as, for example, GaAs, InAs, AlAs, GaN, AlN, InN, GaP, InP, AlP, GaSb, InSb, AlSb and from mixed crystal systems based on these binary compounds, as well as ZnSe, CdSe, MgSe, BeSe, HgSe, ZnS, CdS, MgS, BeS, HgS, ZnTe, CdTe, MgTe, BeTe, HgTe and mixed crystal systems formed thereof. The substrate material may, for example, be undoped, compensated, p-type conductive or n-type conductive Si, Ge, GaAs, InAs, InGaAs, GaP, InP, $Al_2O_3$, SiC, CdTe, CdZnTe, ZnO or ZnSe. The described buffers underneath the BeTe layers may likewise be made of Si, Ge, GaAs, InAs, InGaAs, GaP, InP, $Al_2O_3$, SiC, CdTe, CdZnTe, ZnO or ZnSe or related mixed crystals.

We claim:

1. A method of producing a semiconductor component, which comprises:
   providing a substrate;
   epitaxially growing an Se-free II-VI interlayer based on BeTe on the substrate in a substantially Se-free and S-free first epitaxy chamber; and
   epitaxially growing an active layer sequence with at least one II-VI semiconductor layer containing an element selected from the group consisting of Se and S on the Se-free II-VI interlayer.

2. The method according to claim 1, which comprises growing the interlayer with a material selected from the group consisting of $Be_xMg_yZn_{1-x-y}Te$, $Be_xZn_yCd_{1-x-y}Te$, $Be_xZn_yMn_{1-x-y}Te$, and $Be_xMn_yCd_{1-x-y}Te$ where $0 \leq x \leq 1$, $0 \leq y \leq 1$, $0 \leq x+y \leq 1$.

3. The method according to claim 1, wherein the substrate is a III-V semiconductor material substrate.

4. The method according to claim 3, which comprises selecting the substrate from the group consisting of GaAs, InAs, and InGaAs.

5. The method according to claim 1, which comprises adjusting a thickness of the interlayer to from 0.5 to 100 monolayers.

6. The method according to claim 1, which comprises, prior to the step of epitaxially growing the Se-free II-VI interlayer, applying a buffer layer on the substrate.

7. The method according to claim 6, wherein the applying step comprises forming the buffer layer, in dependence on a semiconductor material of the substrate, from a material selected from the group consisting of GaAs, InAs, InGaAs, InP, GaP, GaSb, GaN, and mixed crystals formed thereof, from a material selected from the group consisting of Ge, Si, SiGe, SiC, $Si_xC_{1-x}$, and mixed crystals formed thereof, where x is a number from 0 to 1, from a material selected from the group consisting of ZnO, ZnSe, CdTe, CdZnTe, and mixed crystals formed thereof, or from $Al_2O_3$.

8. The method according to claim 7, wherein the buffer layer is an undoped layer.

9. The method according to claim 7, wherein the buffer layer is an n-type conductive doped layer.

10. The method according to claim 7, wherein the buffer layer is a p-type conductive doped layer.

11. The method according to claim 6, wherein the applying step is performed in an epitaxy chamber and the interlayer is produced on the upper layer in the epitaxy chamber in which the buffer layer is produced.

12. The method according to claim 6, which comprises growing an As-rich surface prior to growing the interlayer on the buffer layer.

13. The method according to claim 1, which further comprises a further layer grown on the interlayer before the active layer sequence is grown.

14. The method according to claim 1, which comprises growing the interlayer with a material selected from the group consisting of a compound containing Be, Mg, Zn, and Te; a compound containing Be, Zn, Cd, and Te; a compound containing Be, Zn, Mn, and Te; and a compound containing Be, Mn, Cd, and Te.

* * * * *